(12) United States Patent
Kim

(10) Patent No.: US 6,238,962 B1
(45) Date of Patent: May 29, 2001

(54) METHOD OF FABRICATING STATIC RANDOM ACCESS MEMORY CELL WITH VERTICALLY ARRANGED DRIVE TRANSISTORS

(75) Inventor: Dong Sun Kim, Seoul (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/547,138

(22) Filed: Apr. 11, 2000

Related U.S. Application Data

(62) Division of application No. 09/000,609, filed on Dec. 30, 1997, now Pat. No. 6,081,041.

(30) Foreign Application Priority Data

Dec. 31, 1996 (KR) .................................................. 96-79245

(51) Int. Cl.[7] .............................................. H01L 21/8244
(52) U.S. Cl. .......................................... 438/206; 438/202
(58) Field of Search ................................... 438/279, 213, 438/225, 294, 297, 206

(56) References Cited

U.S. PATENT DOCUMENTS

| | | | |
|---|---|---|---|
| 5,122,846 | 6/1992 | Haken | 257/66 |
| 5,298,764 | 3/1994 | Yamanaka et al. | 257/67 |
| 5,489,790 | 2/1996 | Lage | 257/330 |
| 5,744,393 | * 4/1998 | Risch et al. | 438/206 |

OTHER PUBLICATIONS

T. Kikuchi et al., "A 0.35μm ECL–CMOS Process Technology on SOI for Ins Mega–bits SRAM's with 40ps Gate Array" 1995; IEDM 95 pp.—923–926.

* cited by examiner

Primary Examiner—Richard Elms
Assistant Examiner—Beth E. Owens
(74) Attorney, Agent, or Firm—Morgan, Lewis & Bockius LLP

(57) ABSTRACT

A method of fabricating an SRAM cell having a first conductivity type substrate includes the steps of forming a well of a second conductivity type in the first conductivity type substrate, forming a first active region of a first access transistor and a second active region of a second access transistor in the well, the first and second active regions being in parallel with each other, forming a first trench in the first active region and a second trench in the second active region, wherein the first and second trenches extend into the substrate through the well, forming gate electrodes of the first and second access transistors on the active regions, forming gate electrodes of first and second drive transistors in the first and second trenches, respectively, implanting first conductivity type impurity ions into the active regions of the first and second access transistors, respectively, forming first and second load devices on the substrate, the first and second load devices electrically contacting first terminals of the first and second access transistors, and first and second bit lines electrically contacting second terminals of the first and second access transistors.

7 Claims, 10 Drawing Sheets active region

METHOD OF FABRICATING STATIC RANDOM ACCESS MEMORY CELL WITH VERTICALLY ARRANGED DRIVE TRANSISTORS

This is a divisional of application Ser. No. 09/000,609 filed on Dec. 30, 1997 now U.S. Pat. No. 6,081,041.

This application claims the benefit of Korean Application No. 79245/1996 filed on Dec. 31, 1996, which is hereby incorporated by reference.

BACKGROUND OF THE INVENTION

1. Field of the Invention

The present invention relates to a method of fabricating a semiconductor device, and more particularly, to a method of fabricating a static random access memory (SRAM) cell. Although the present invention is suitable for a wide scope of applications, it is particularly suitable for realizing the high packing density and cell stabilization of the static random access memory cell.

2. Discussion of the Related Art

Since a static random access memory (hereinafter referred to as SRAM) does not require refreshing of the memory and its operation timing is easily adjustable, it is capable of having the same access time and cycle time as a microcomputer. Further, the SRAM can be operated as fast as a random access memory (RAM). Accordingly, SRAMs are widely used in buffer memories of large size calculators, main memories in supercomputers, and control memories.

SRAMs using a flip-flop are classified into Enhancement/Depletion (E/D) type SRAMs, complementary metal oxide semiconductor (CMOS) type SRAMs, and high resistance-load type SRAMs.

A conventional SRAM cell will be explained with reference to the accompanying drawings.

FIG. 1 and FIG. 2 are an equivalent circuit diagram and a layout of a conventional SRAM cell, respectively.

Referring to FIG. 1, first and second drive transistors TD1 and TD2 are based on a unit cell of a flip-flop, and gates of the first and second drive transistors TD1 and TD2 are connected to "B" and "A" points, respectively. As shown, in each of the unit cells, the first and second access transistors TA1 and TA2 are respectively connected to bit-lines B/L1 and B/L2, and their gates are connected to the word-line W/L.

Referring to FIG. 2, a layout of a conventional SRAM cell has a complicated structure because active regions are formed having irregular shapes. That is, an SRAM cell includes active regions irregularly formed in a limited region, gate electrodes of first and second access transistors formed in predetermined portions of the active regions, and gate electrodes of first and second drive transistors. The gate electrode of the first access transistor and the gate electrode of the second drive transistor are connected to each other on a drain region of the first access transistor. Also, the gate electrode of the second access transistor and the gate electrode of the first drive transistor are connected to each other on a drain region of the second access transistor. The gate electrode of the second drive transistor is connected to the drain of the first drive transistor through a first contact hole. The gate electrode of the second drive transistor is connected to a load resistance R1 through a second contact hole. At this time, the first and second contact holes are located in the same line.

Operations of the conventional SRAM will now be explained with reference to FIG. 1 as follows.

When a high signal is applied to a word-line W/L, the first and second access transistors TA1 and TA2 are turned on, so that the unit cell is electrically connected to the bit-line. When the first drive transistor TD1 is off and the second drive transistor TD2 is on, the data of the bit-line B/L2 is transmitted to a memory cell through the second access transistor TA2. In contrast, when the first drive transistor TD1 is off, the bit-line B/L1 has no path for current and is charged-up by the first access transistor TA1. In other words, when a high level data is written in the memory cell, a voltage larger than a threshold voltage is applied to the word-line so that the first and second access transistors TA1 and TA2 are turned on. The high level data is thus applied to an "A" point. Since the electric potential of the A point is a high level, a high signal is applied to the gate of the second drive transistor TD2 connected to the A point, and the second drive transistor TD2 is turned on. In contrast, a low level data of the bit-line B/L2 is applied to a "B" point, so that the first drive transistor is turned off.

Subsequently, in reading data, the bit-lines B/L1 and B/L2 become equi-potentials and a voltage larger than the threshold voltage is applied to the word-line, thereby turning on the first and second access transistors TA1 and TA2. Accordingly, when the data is the high level at the A point, the electric potential of the bit-line B/L1 is increased. Conversely, when the data is the low level at the A point, the electric potential of the bit-line B/L1 is decreased.

FIG. 3 is a cross-sectional view showing a structure of a conventional SRAM. The conventional SRAM includes a field oxide layer 42 to define first and second active regions on a first conductivity type semiconductor substrate 41, a gate electrode 43 of an access transistor on the first active region, and a gate electrode 44 of a drive transistor spaced by a predetermined distance from the gate electrode 43 covering the field oxide layer 42 and on the second active region, source and drain impurity regions 46 and 46a having a second conductivity type in the substrate 41 at both sides of the gate electrode 44 of the access transistor, an insulating layer 47 having a contact hole exposing the gate electrode 44 of the drive transistor on the entire surface including the gate electrode 43 and 44, a load resistance layer 50 electrically contacting the gate electrode 44 of the drive transistor over the insulating layer 47, a ground line 48 between the load resistance layer 50 and the gate electrode 44 of the drive transistor insulated from the load resistance layer 50 and the gate electrode 44 of the drive transistor, and a bit-line 52 contacting a source impurity region of the second conductivity type through the contact hole.

A conventional method of fabricating an SRAM cell having the aforementioned structure will be explained with the accompanying drawings as illustrated in FIGS. 4A to 4D.

Referring to FIGS. 4A, a first polysilicon layer is formed on the entire surface of a first conductivity type semiconductor substrate 41 having active regions defined by a field oxide layer 42. POCl$_3$ is doped into the first polysilicon layer. Next, a photoresist layer (not shown) is coated on the first polysilicon layer to define gate electrode regions of an access transistor and a drive transistor. The first polysilicon layer is selectively removed by a photo-etching process to form gate electrodes 43 and 44 of an access transistor and of a drive transistor. Then, with the gate electrodes 43 and 44 serving as masks, impurity ions of the second conductivity type are lightly doped into the substrate 41.

Subsequently, a first insulating layer is formed on the entire surface including the gate electrodes 43 and 44 and then is etched-back to form sidewalls 45 on both sides of the gate electrode 43 of the access transistor. With the sidewalls 45 serving as masks, impurity ions having the second conductivity type are heavily doped to form source and drain impurity regions 46 and 46a having a lightly doped drain (LDD) structure. In this process, the portion, which is the boundary of the active region and the gate electrode 44 of the drive transistor, indicated as "A" in FIG. 4A is formed by the diffusion of doped $POCl_3$ into the first polysilicon layer.

Referring to FIG. 4B, a second polysilicon layer 47 is then formed on the entire surface including the gate electrodes 43 and 44, a second insulating layer 47. Subsequently, a photoresist layer is coated on the second polysilicon layer to define a power-line. Next, the photoresist layer is patterned with a photo-etching process to form a ground line 48.

Referring to FIG. 4C, a third insulating layer 49 is formed on the entire surface of the second insulating layer 47 including the ground-line 48. Subsequently, the second and third insulating layers 47 and 49 are selectively removed to form a contact hole exposing the gate electrode 44 of the drive transistor. Then, a third polysilicon layer is formed and then patterned to electrically contact the gate electrode 44 of the drive transistor to form a load resistance layer 50.

Referring to FIG. 4D, a planarizing insulating layer 51 is formed on the entire surface of the third insulating layer 49 including the load resistance layer 50, and then is partially removed to expose a portion of the surface of the substrate 41 and form a contact hole over the source impurity region 46 of the access transistor. Next, a metal layer is formed on the entire surface including the planarizing insulating layer 51 and then patterned to form a bit-line 52, thereby completing the overall process of a conventional SRAM cell.

However, a conventional SRAM cell and a method of fabricating the same have the following problems.

Since active regions, as shown in the layout in FIG. 2, are unsymmetrically formed, drive transistors are also formed unsymmetrical. As a result, it is very difficult to stabilize the data in the cell. Further, limitations in the packing density due to the layout also limit the width of a drive transistor.

SUMMARY OF THE INVENTION

Accordingly, the present invention is directed to a static random access memory cell and a method of fabricating the same that substantially obviate one or more of problems due to limitations and disadvantages of the related art.

An object of the invention is to provide an SRAM cell having vertically arranged drive transistors and a method of fabricating the same to improve the packing density and data stabilization in the cell.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a static random access memory (SRAM) cell includes a substrate having first and second semiconductor layers, the second semiconductor layer being on the first semiconductor layer, active regions of first and second access transistors in the second semiconductor layer, gate electrodes of the first and second access transistors on the active regions, gate electrodes of first and second drive transistors in first terminals of the first and second access transistors, respectively, the gate electrodes penetrating the second semiconductor layer, first and second load resistors electrically contacting the first terminals of the first and second access transistors, respectively, and first and second bit lines electrically contacting second terminals of the first and second access transistors, respectively.

In another aspect of the invention, a method of fabricating an SRAM cell having a first conductivity type substrate, the method includes the steps for forming a well of a second conductivity type in the first conductivity type substrate, forming active regions of first and second access transistors in the well, the active regions being in parallel with each other, forming first and second trenches in the active regions, the first and second trenches penetrating the well, forming gate electrodes of the first and second access transistors on the active regions, forming gate electrodes of first and second drive transistors in the first and second trenches, respectively, implanting first conductivity type impurity ions into the active regions of the first and second access transistors, respectively, forming first and second load devices on the substrate, the first and second load devices electrically contacting first terminals of the first and second access transistors, and forming first and second bit lines electrically contacting second terminals of the first and second access transistors.

In a further aspect of the invention, the method of fabricating an SRAM cell having a first conductivity type substrate, the method includes the steps of forming a well of a second conductivity type in the substrate, forming first and second active regions in the well, forming first and second trenches penetrating the well in the first and second active regions, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
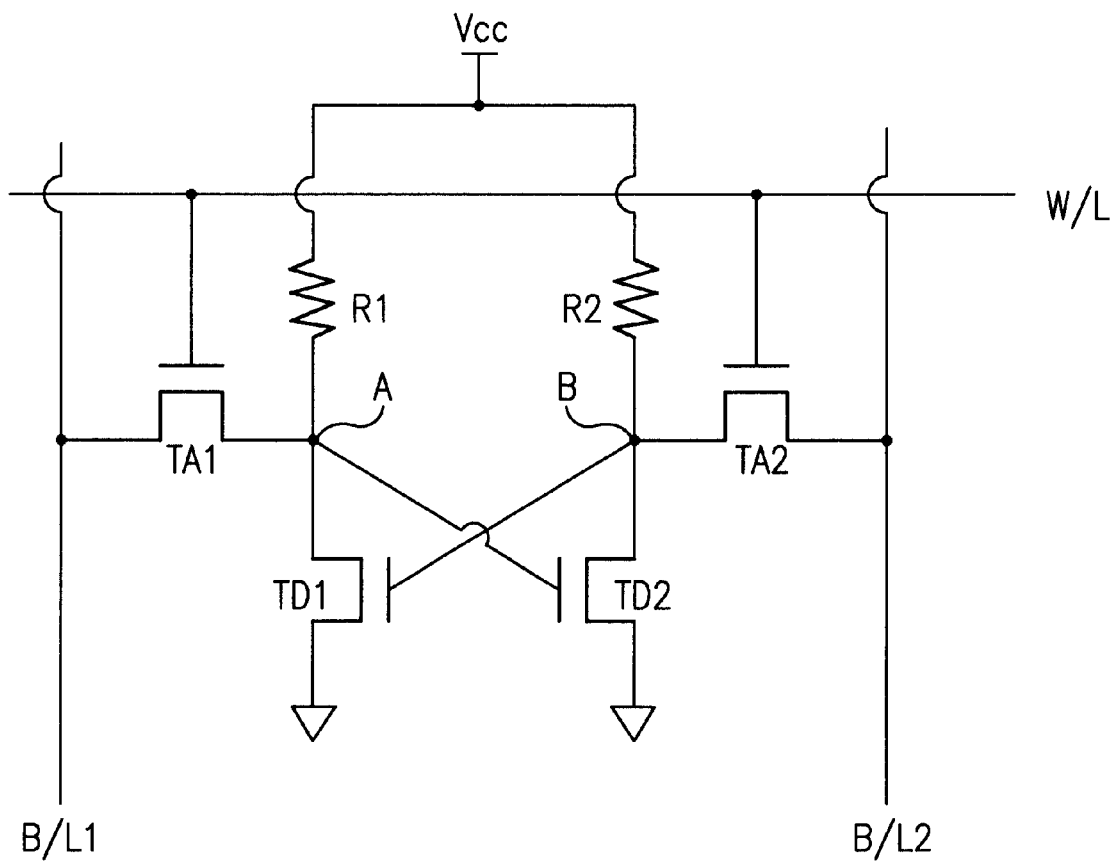
FIG. 1 is an equivalent circuit diagram of a conventional SRAM cell.
Figure 2:
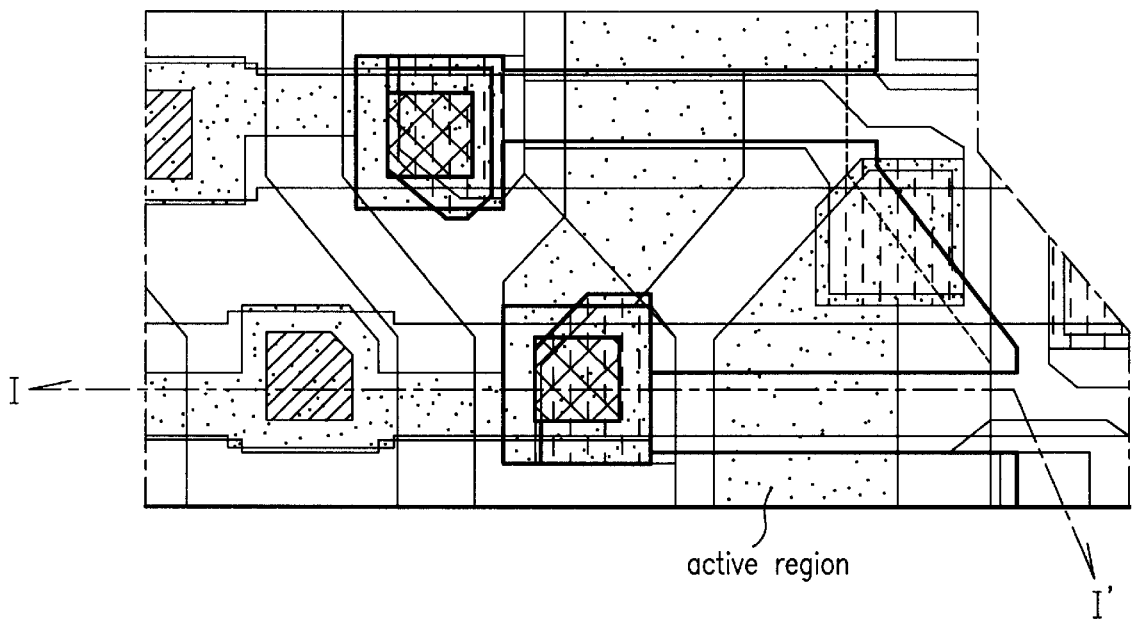
FIG. 2 is a layout of the conventional SRAM cell.
Figure 3:
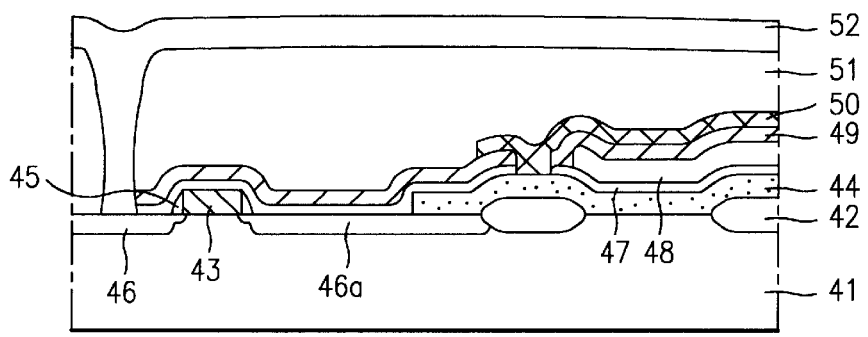
FIG. 3 is a cross-sectional view of the conventional SRAM cell, taken along line I—I' of FIG. 2.
Figure 4A:
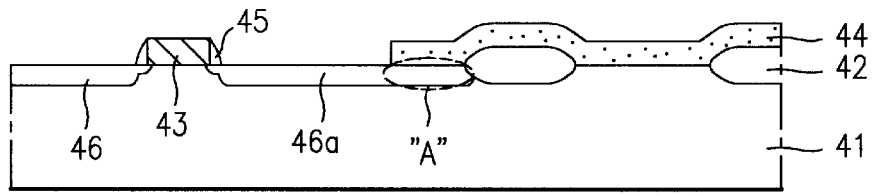
FIGS. 4A to 4D are cross-sectional views illustrating the process steps of fabricating the conventional SRAM cell.
Figure 4B:
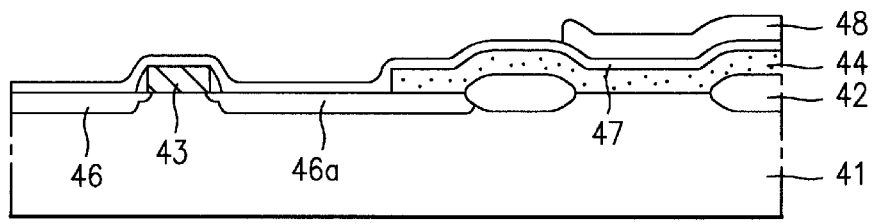
Figure 4C:
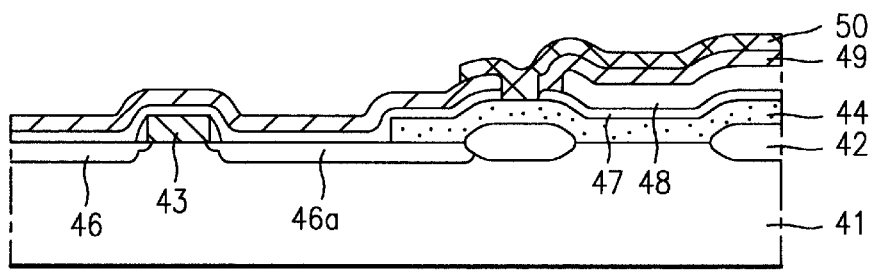
Figure 4D:
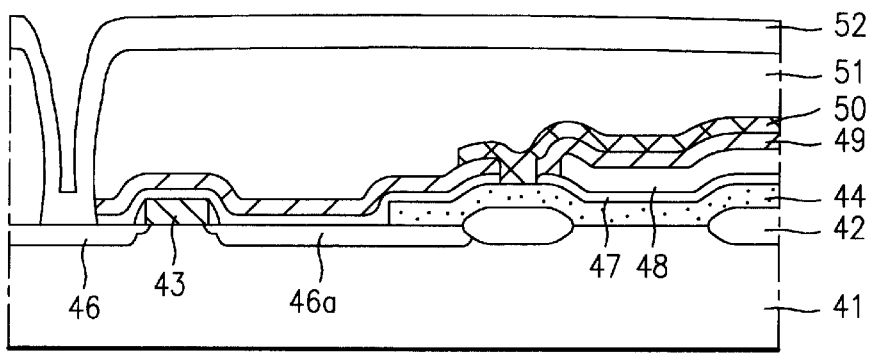
Figure 5:
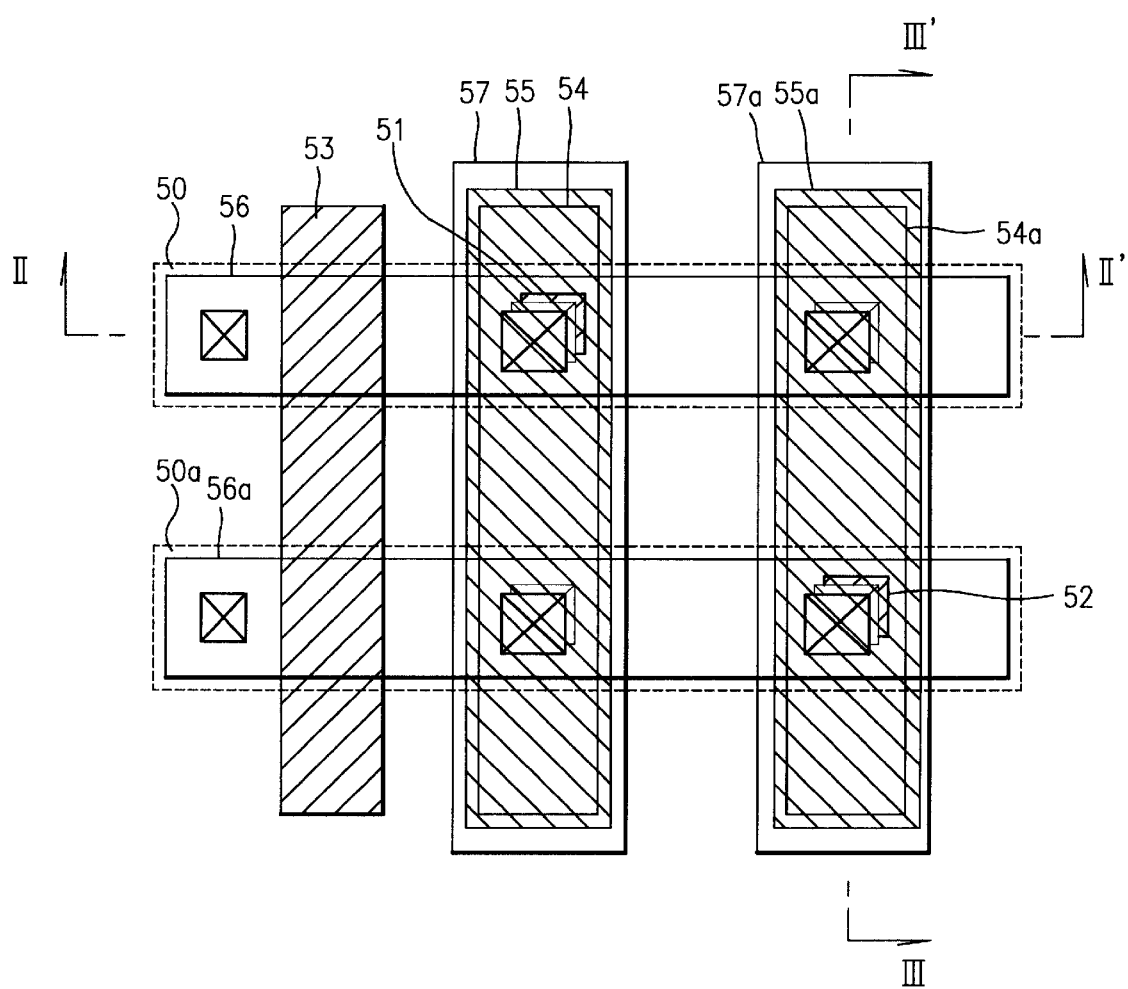
FIG. 5 is a layout of an SRAM cell in accordance with a preferred embodiment of the present invention.

As shown in FIG. 5, an SRAM cell of the present invention includes first and second active regions 50 and 50a isolated from each other in parallel, first and second drive transistor gate electrodes 51 and 52 respectively formed on the first and second active regions 50 and 50a, and an access transistor gate electrode 53 formed perpendicularly to the first and second active regions 50 and 50a.

Source and drain regions (not shown) of the first drive transistor are formed in the first active region 50. Source and drain regions (not shown) of the second drive transistor are formed in the second active regions 50a. The first and second drive transistor gate electrodes 51 and 52 are located on a diagonal from each other.

Accordingly, the drain of the first drive transistor and the second drive transistor-gate electrode 52 are located in the same conductivity material layer, and the drain of the second drive transistor and the first drive transistor gate electrode 51 are located in the same conductivity material layer, respectively.

First conductivity material layer 54 is formed to electrically contact the first drive transistor gate electrode 51 and the drain of the second drive transistor. Also, a second conductivity material layer 54a is formed to electrically contact the second drive transistor gate electrode 52 and the drain of the first drive transistor. The first and second conductivity material layers 54 and 54a are formed perpendicularly to the first and second active regions 50 and 50a.

First and second load resistance layers 55 and 55a electrically contact the first and second conductivity material layers 54 and 54a, respectively, through the contact holes on the drive transistor gate electrodes 51 and 52. First and second bit-lines 56 and 56a contact the source of the access transistor through contact holes and are formed perpendicularly to the access transistor gate electrode 53. First and second power-lines 57 and 57a electrically contact the first and second load resistance layers 55 and 55a through the contact hole formed on the drain of the drive transistor.

A gate electrode material is formed on the entire surface of the substrate including a trench and then patterned to form the first and second drive transistor gate electrodes 51 and 52.

Figure 6A:
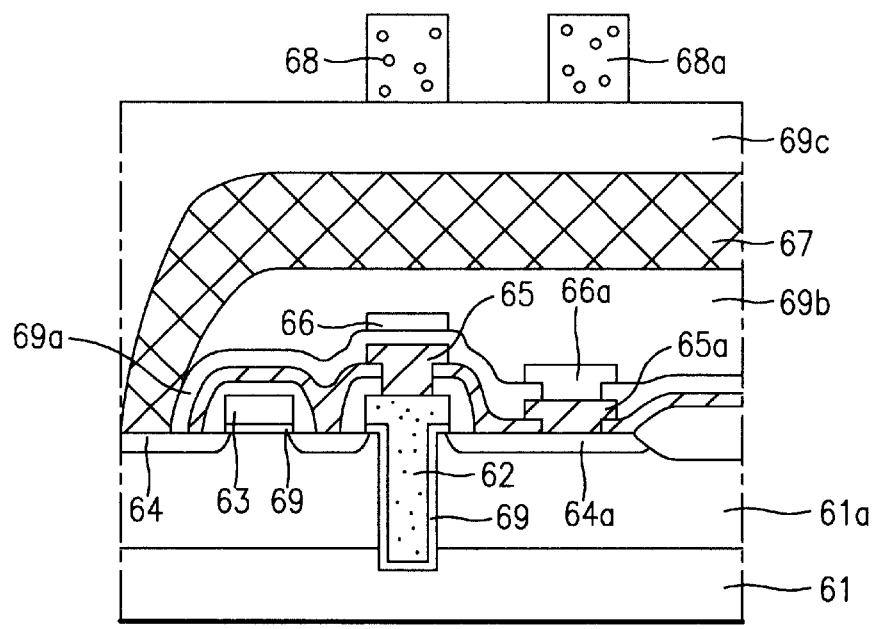
FIG. 6A is a cross-sectional view of the SRAM, taken along line II—II' of FIG. 5.
Figure 6B:
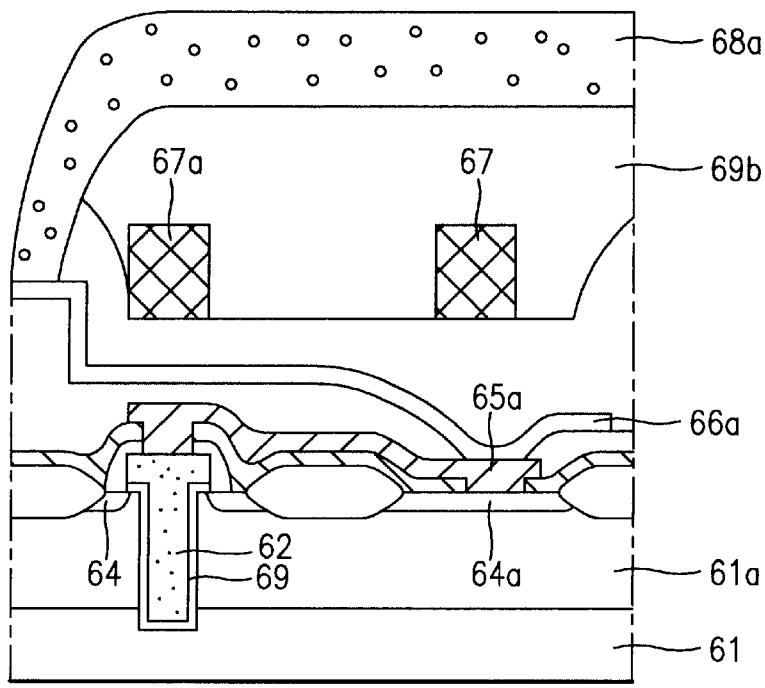
FIG. 6B is a cross-sectional view of the SRAM, taken along line III—III' of FIG. 5.

FIGS. 6A to 6B are cross-sectional views taken along lines II—II' and III—III' shown in FIG. 5, respectively.

Referring to FIG. 6A, the SRAM cell of the present invention includes a second conductivity type well 61a having a predetermined depth in a first conductivity type semiconductor substrate 61 where field regions and active regions are defined; a trench in the first conductivity type semiconductor substrate 61 through the second conductivity type well 61a; a first drive transistor gate electrode 62 at the trench; an access transistor gate electrode 63 on the second conductivity type well 61a; first and second impurity regions 64 and 64a having the first conductivity type in the substrate at both sides of the first drive transistor gate electrode 62 and the access transistor gate electrode 63; first and second conductivity material layers 65 and 65a respectively contacting the first drive transistor gate electrode 62 and the second impurity region 64a having the first conductivity type through contact holes, respectively; a first load resistance layer 66 on an insulating layer 69a on the first conductivity material layer 65; a second load resistance layer 66a contacting the second conductivity material layer 65a through the contact hole; a first bit-line 67 contacting the first impurity region 64 having the first conductivity type in the substrate at both sides of the access transistor gate electrode 63; and first and second power-lines 68 and 68a isolated from each other and formed on a third insulating layer 69c on the first bit-line 67.

A gate insulating layer 69 is located between the access transistor gate electrode 63 and the second conductivity type well 61a. Through the first conductivity material layer 65, the first drive transistor gate electrode 62 electrically contacts the drain of the second drive transistor (not shown), while the second drive transistor gate electrode (not shown) electrically contacts the drain of the first drive transistor through the second conductivity material layer 65a. A depth of the trench is greater than the second conductivity type well 61a to expose the substrate 61.

Referring to FIG. 6B, which is a cross-sectional view taken along line III—III' of FIG. 5, the SRAM cell includes a second conductivity type well 61a having a predetermined depth in a first conductivity type semiconductor substrate 61 where field regions and first and second active regions are defined; a trench in the first conductivity type semiconductor substrate 61 through the second conductivity type well 61a in the first active region; a gate insulating layer 69 surrounding the trench and on a predetermined portion of the first active region around the trench; first and second impurity regions 64 and 64a having the first conductive type in the first and second active regions at both sides of the gate insulating layer 69; a second drive transistor gate electrode 62 in the trench and on the first active region around the trench; the second drive transistor gate electrode 62 contacting the second impurity region 64a having the first conductivity type through a second conductivity material layer 65a; a second load resistance layer 66a contacting the second conductivity material layer 65a on the second impurity region 64a having the first conductive type through a contact hole; first and second bit-lines 67 and 67a having a predetermined width on an insulating layer 69b formed on the second load resistance layer 66a and isolated from each other; and a second power-line 68a contacting the second load resistance layer 66a through a contact hole in an insulating layer formed on the entire surface including the first and second bit-lines 67 and 67a.

The trench is deeper than the second conductivity type well 61a to expose the first conductivity type semiconductor substrate 61. Through the second load resistance layer 66a, the first drive transistor drain electrode contacts the second power-line 68a through the contact hole.

A method of fabricating the SRAM cell in accordance with a preferred embodiment of the present invention will now be explained with reference to the attached drawings.

FIGS. 7A to 7O and 8A to 8O are cross-sectional views, respectively taken along lines II—II' and III—III' shown in FIG. 5.

Figure 7A:
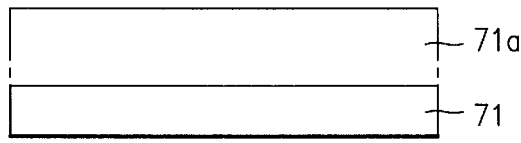
FIGS. 7A to 7O and 8A to 8O are cross-sectional views, respectively taken along lines II—II' and III—III' of FIG. 5, illustrating the process steps of an SRAM cell in accordance with a preferred embodiment of the present invention.
Figure 8A:
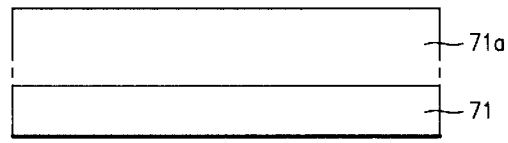

As shown in FIGS. 7A and 8A, second conductivity type impurity ions are implanted into a first conductivity type semiconductor substrate 71 to form a second conductivity type well 71a having a predetermined depth.

Figure 7B:
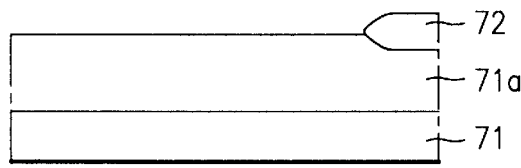
Figure 8B:
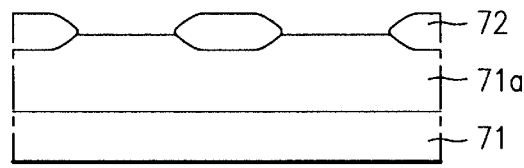

FIGS. 7B and 8B shows that a field ion implantation process is performed into the second conductivity type well 71a. An active region is defined by forming a field oxide layer 72 in the second conductivity type well 71a.

Figure 7C:
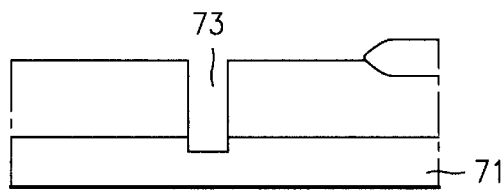
Figure 8C:
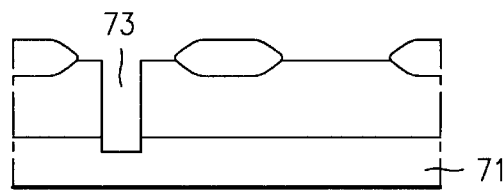

Subsequently, as shown in FIG. 7C and 8C, the second conductivity type well 71a of the active region is etched to a predetermined depth to form a trench 73. A depth of the trench 73 is deeper than the well 71a. Accordingly, the first conductivity type semiconductor substrate 71 is exposed by the trench 73.

Figure 7D:
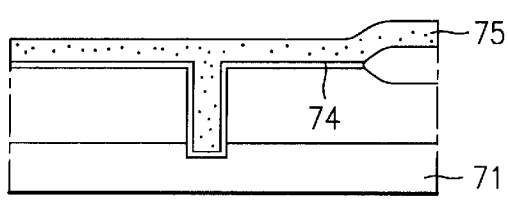
Figure 8D:
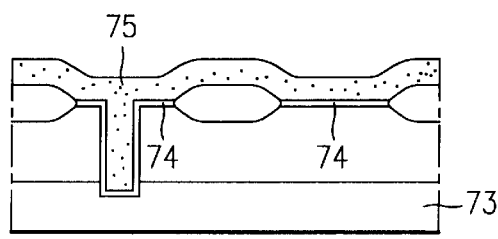

Next, a gate insulating layer 74 is formed on the active region including the trench 73 as shown in FIGS. 7D and 8D. A first conductivity layer 75 is then formed on the entire surface including the gate insulating layer 74.

Figure 7E:
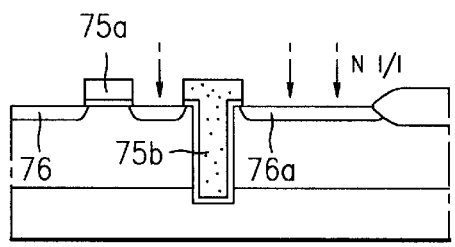
Figure 8E:
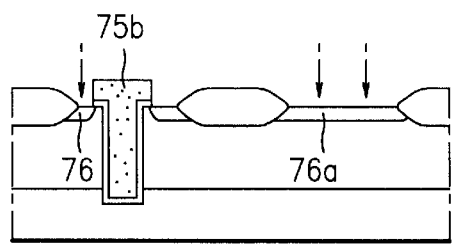

Thereafter, as shown in FIGS. 7E and 8E, the first conductivity layer 75 is patterned to form an access transistor gate electrode 75a and a drive transistor gate electrode 75b. Then, with the gate electrodes 75a and 75b serving as masks, first and second impurity regions 76 and 76a having the first conductivity type are formed in the second conductivity type well 71a by implanting the first conductivity type impurity. At this time, as shown in FIG. 7E the first impurity region 76 having the first conductivity type is a drain of the access transistor, while the second impurity region 76a having the first conductivity type is a drain of the first drive transistor. The second impurity region 76a having the first conductive type is a drain of the first drive transistor, as shown in FIG. 8E.

Figure 7F:
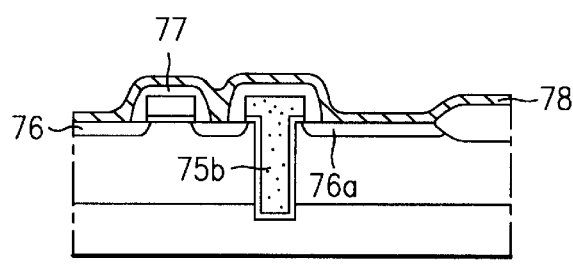
Figure 8F:
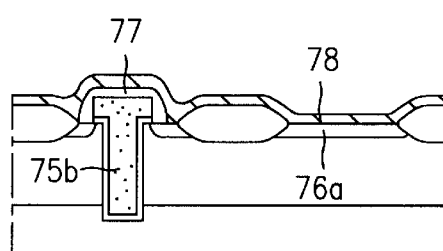

In FIGS. 7F and 8F, a first insulating layer 77 is formed on the entire surface including the substrate 71 and then selectively etched to form a contact hole over the surface of the first and second impurity regions 76 and 76a having the first conductivity type. Next, a second insulating layer 78 is formed on the entire surface including the contact holes. As the same as in FIG. 7F, the first insulating layer 77 is selectively removed to expose the second impurity region 76a, and then the second insulating layer 78 is formed on the entire surface as shown in FIG. 8F.

Figure 7G:
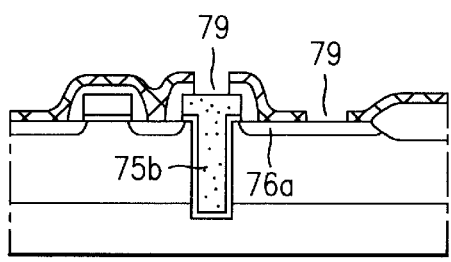
Figure 8G:
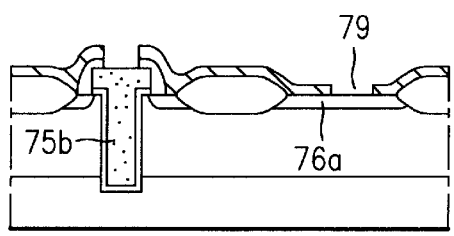

Subsequently, in FIGS. 7G and 8G, the first and second insulating layers 77 and 78 on the drive transistor gate electrode 75b and the second insulating layer 78 on the second impurity region 76a are partially removed to form a contact hole 79.

Figure 7H:
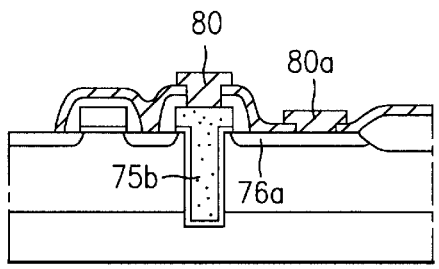
Figure 8H:
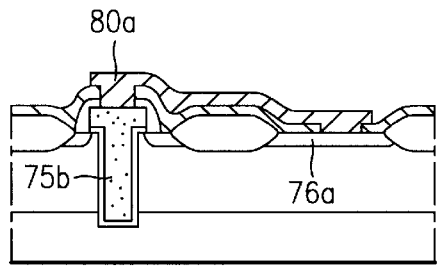

Next, as shown in FIGS. 7H and 8H, first and second conductivity material layers 80 and 80a are formed to respectively contact the drive transistor gate electrode 75b and the second impurity region 76a through the contact hole 79. FIG. 7H shows both the first and second conductivity material layers 80 and 80a, whereas FIG. 8H shows only the second conductivity layer 80a electrically contacting the drive transistor gate electrode 75b and the drain of another drive transistor (not shown).

Figure 7I:
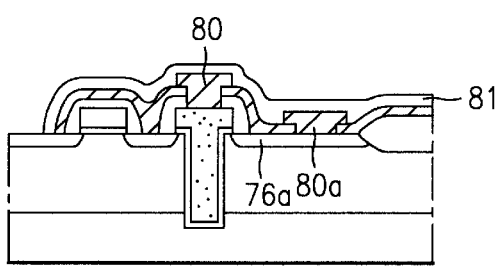
Figure 8I:
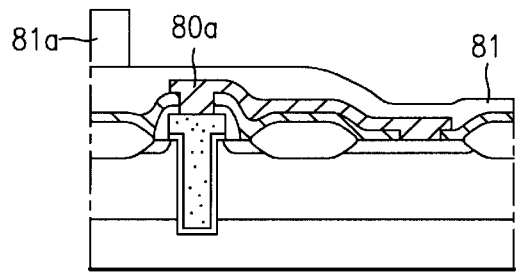

In FIGS. 7I and 8I, third and fourth insulating layers 81 and 81a are successively formed on the entire surface including the first and second conductive material layers 80 and 80a. The fourth insulating layer 81a in FIG. 7I is partially etched-back (not shown).

Figure 7J:
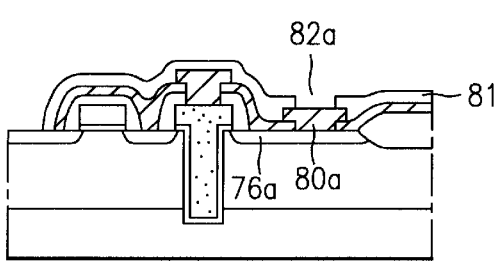
Figure 8J:
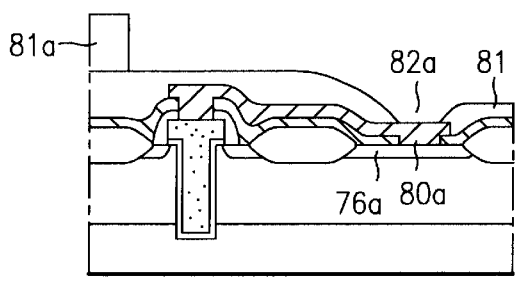

Subsequently, as shown in FIGS. 7J and 8J, the third insulating layer 81 is selectively removed to form second contact holes 82a. The third insulating layer 81 in FIG. 7J is selectively removed to expose the second conductivity material layer 80a electrically contacting the second impurity region 76a having the first conductivity type. As in FIG. 7J, the third insulating layer 81 in FIG. 8J is selectively removed to expose the second conductivity material layer 80a electrically contacting the second impurity region 76a having the first conductivity type.

Figure 7K:
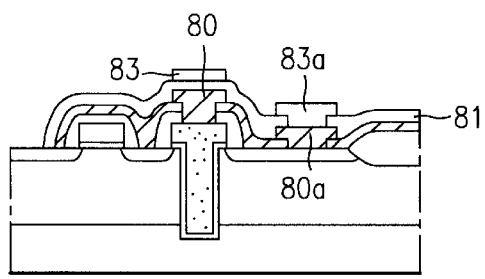
Figure 8K:
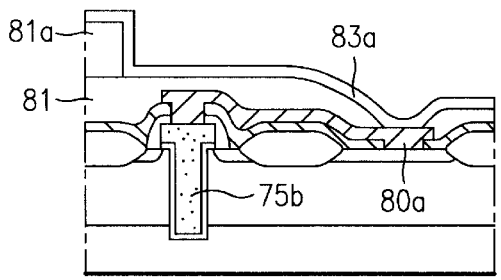

First and second load resistance layers 83 and 83a are formed in FIGS. 7K and 8K to electrically contact the first and second conductivity material layers 80 and 80a respectively through the second contact holes 82a. That is, the second load resistance layer 83a is formed on the second conductivity material layer 80a, whereas the first load resistance 83 is formed on the third insulating layer 81 formed on the first conductivity material layer 80, as shown in FIG. 7K. The first load resistance layer 83 electrically contacts the first conductivity material layer 80 through the contact hole formed over the drain of the second drive transistor. As shown in FIG. 8K, through the second conductivity material layer 80a, the second drive transistor gate electrode 75b electrically contacts the drain of the first drive transistor and the second conductivity material layer 80a contacts the drain of the first drive through the contact hole respectively.

Figure 7L:
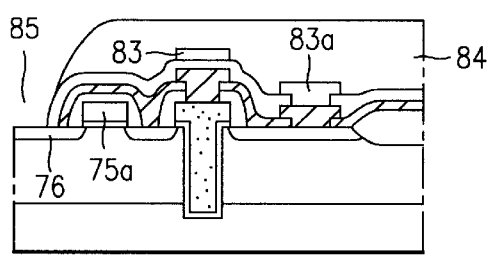
Figure 8L:
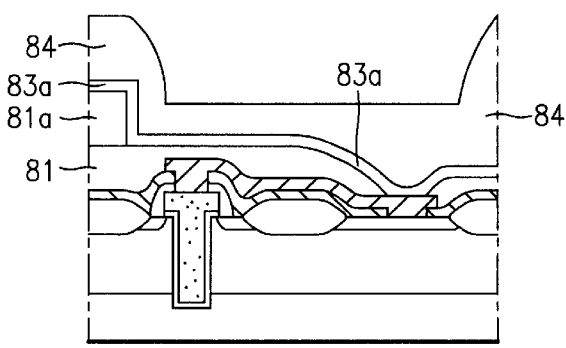

Subsequently, a fifth insulating layer 84 is formed on the entire surface including the first and second load resistance layers 83 and 83a as shown in FIGS. 7L and 8L. The fifth insulating layer 84 is then selectively removed in FIG. 7L to expose the impurity region 76. Thus, a third contact hole 85 is formed over the impurity region 76 to be used as the source in the active region at both sides of the access transistor gate electrode 75a.

Figure 7M:
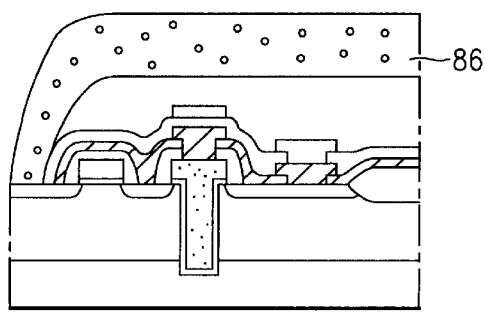
Figure 8M:
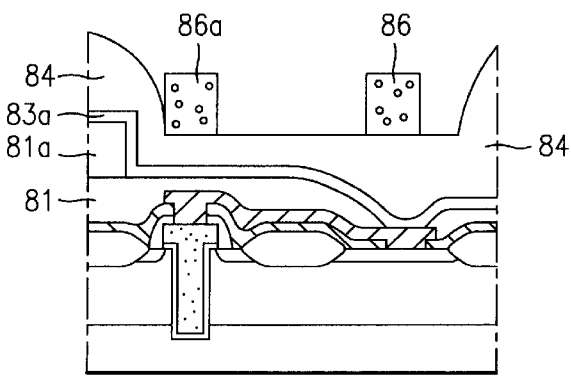

FIGS. 7M and 8M illustrate that a conductivity material is formed on the entire surface including the third contact hole 85 and then patterned to form first and second bit-lines 86 and 86a. Although not shown, the first bit-line 86 contacts the source of the first access transistor through the contact hole, 85 and the second bit-line 86a contacts the source of the second access transistor through the contact hole. FIG. 7M shows only the first bit-line 86.

Figure 7N:
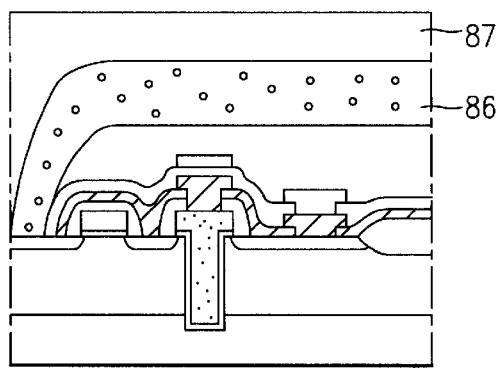
Figure 8N:
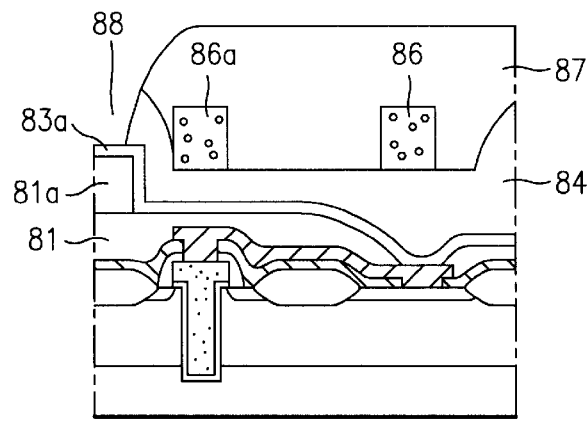

A sixth insulating layer 87 in FIGS. 7N and 8N is formed on the entire surface including the first and second bit-lines 86 and 86a. The fifth and sixth insulating layers 84 and 87 are then selectively removed to expose a predetermined portion of the second load resistance layer 83a around the gate of the second drive transistor, thereby forming a fourth contact hole 88.

Figure 7O:
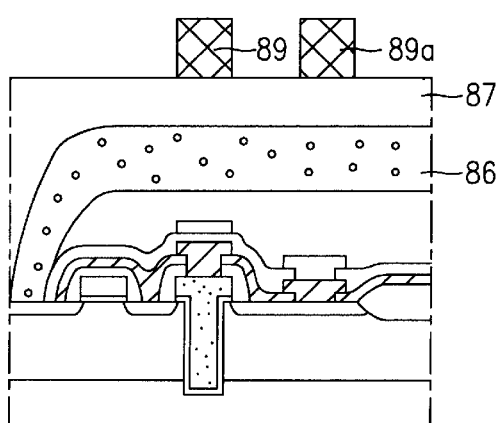
Figure 8O:
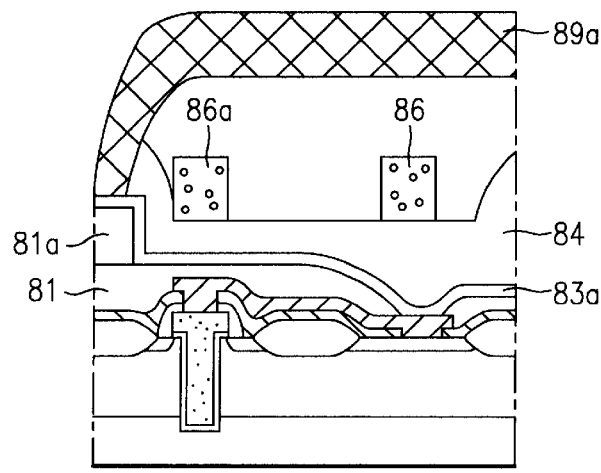

As shown in FIGS. 7O and 8O, a layer for power-lines is formed on the entire surface of the sixth insulating layer 87 including the fourth contact hole 88, and then patterned to form first and second power-lines 89 and 89a, respectively.

An SRAM memory cell of the present invention and a method of fabricating the same have the following advantages.

First, since drive transistors are formed in a vertical structure and cell size is greatly reduced, high packing density is readily achieved using the structure of the present invention.

Second, since the drive transistors have a wide structure, the driving current is increased. The data in the cell is thus stabilized.

Third, a semiconductor substrate is used as a ground of the cell so that the resistance of the ground is reduced.

Fourth, the symmetry of drive transistors is improved.

It will be apparent to those skilled in the art that various modifications and variations can be made in the SRAM cell and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an SRAM cell having a first conductivity type substrate, the method comprising the steps of:

forming a well of a second conductivity type in the first conductivity type substrate;

forming a first active region of a first access transistor and a second active region of a second access transistor in the well, the first and second active regions being in parallel with each other;

forming a first trench in the first active region and a second trench in the second active region, wherein the first and second trenches extend into the first conductivity type substrate through the well;

forming gate electrodes of the first and second access transistors on the active regions;

forming gate electrodes of first and second drive transistors in the first and second trenches, respectively;

implanting first conductivity type impurity ions into the active regions of the first and second access transistors, respectively;

forming first and second load devices on the substrate, the first and second load devices electrically contacting first terminals of the first and second access transistors; and forming first and second bit lines electrically contacting second terminals of the first and second access transistors.

2. The method according to claim 1, wherein the gate electrodes of the access transistors and gate electrodes of the drive transistors are formed simultaneously.

3. The method according to claim 1, wherein, in the step of forming the gate electrodes of the first and second drive transistors, channels thereof are formed vertically.

4. The method according to claim 1, wherein the first terminals of the first and second access transistors are formed in the first and second trenches, respectively.

5. The method according to claim 1, wherein the first terminals of the access transistors are formed common drain regions of the access and drive transistors.

6. The method according to claim 1, further comprising the step of forming a gate insulating layer on the first conductivity type substrate and in the well of the second conductivity type prior to the steps of forming gate electrodes of the access and drive transistors.

7. A method of fabricating an SRAM cell having a first conductivity type substrate, the method comprising the steps of:

forming a well of a second conductivity type in the substrate;

forming first and second active regions in the well;

forming first and second trenches in the first and second active regions, respectively, wherein the first and second trenches extend into the first conductivity type substrate through the well; and forming gate electrodes of first and second drive transistors in the first and second trenches, respectively.

* * * * *